(12) United States Patent
Zolfaghari et al.

(10) Patent No.: US 8,885,690 B2
(45) Date of Patent: Nov. 11, 2014

(54) POWER CONTROL TECHNIQUES FOR WIRELESS TRANSMITTERS

(71) Applicant: Broadcom Corporation, Irvine, CA (US)

(72) Inventors: Alireza Zolfaghari, Irvine, CA (US); Henrik Tholstrup Jensen, Long Beach, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/898,287

(22) Filed: May 20, 2013

(65) Prior Publication Data

US 2013/0252564 A1   Sep. 26, 2013

Related U.S. Application Data

(63) Continuation of application No. 11/395,907, filed on Mar. 31, 2006, now Pat. No. 8,467,473.

(51) Int. Cl.
| | |
|---|---|
| *H04L 25/00* | (2006.01) |
| *H04K 1/02* | (2006.01) |
| *H03K 19/20* | (2006.01) |
| *H04L 27/00* | (2006.01) |
| *H04B 1/40* | (2006.01) |
| *H04B 1/04* | (2006.01) |

(52) U.S. Cl.
CPC ............ *H04B 1/406* (2013.01); *H04L 27/0008* (2013.01); *H04B 2001/0408* (2013.01)
USPC ............................ 375/216; 375/297; 326/113

(58) Field of Classification Search
USPC .................................. 375/216, 297; 326/113
See application file for complete search history.

(56) References Cited

U.S. PATENT DOCUMENTS

| | | | |
|---|---|---|---|
| 4,381,495 A | 4/1983 | Hotta et al. | |
| 4,471,340 A | 9/1984 | Lewis | |
| 4,845,498 A | 7/1989 | Kubo et al. | |
| 4,864,305 A | 9/1989 | Toyama | |
| 5,214,792 A * | 5/1993 | Alwadish | 455/45 |
| 5,241,702 A | 8/1993 | Dent | |
| 5,450,147 A | 9/1995 | Dorsey-Palmateer | |
| 5,568,070 A | 10/1996 | Osaki et al. | |
| 5,596,403 A | 1/1997 | Schiff et al. | |
| 5,640,076 A | 6/1997 | Youn | |
| 5,732,334 A | 3/1998 | Miyake | |
| 5,746,399 A | 5/1998 | Ehrlich et al. | |

(Continued)

OTHER PUBLICATIONS

U.S. Appl. No. 11/395,907, Final Office Action mailed Jun. 15, 2010, 26 Pgs.

(Continued)

*Primary Examiner* — Leon-Viet Nguyen
*Assistant Examiner* — Sarah Hassan
(74) *Attorney, Agent, or Firm* — McDermott Will & Emery LLP

(57) ABSTRACT

Various embodiments are disclosed relating to power control techniques for wireless transmitters. In an example embodiment, an apparatus is provided that may include a digital-to-analog converter (DAC) adapted to convert a digital amplitude signal to an analog amplitude signal during a first transmission mode and adapted to convert a digital power level signal to an analog power level signal during a second transmission mode.

19 Claims, 8 Drawing Sheets

(56) References Cited

U.S. PATENT DOCUMENTS

| | | |
|---|---|---|
| 5,749,051 A | 5/1998 | Dent |
| 5,852,386 A | 12/1998 | Chantry et al. |
| 5,945,631 A | 8/1999 | Henrikson et al. |
| 6,404,293 B1 | 6/2002 | Darabi et al. |
| 6,408,032 B1 * | 6/2002 | Lye et al. ............... 375/257 |
| 6,519,103 B2 * | 2/2003 | Cyrusian ............... 360/46 |
| 6,727,839 B2 | 4/2004 | Mulder et al. |
| 6,845,232 B2 | 1/2005 | Darabi |
| 6,862,438 B2 | 3/2005 | Darabi |
| 6,917,321 B1 * | 7/2005 | Haurie et al. ............ 341/144 |
| 6,931,267 B2 | 8/2005 | Darabi |
| 6,961,552 B2 | 11/2005 | Darabi et al. |
| 6,963,733 B2 | 11/2005 | Eriksson et al. |
| 6,968,019 B2 | 11/2005 | Darabi et al. |
| 6,970,681 B2 | 11/2005 | Darabi et al. |
| 7,183,949 B2 | 2/2007 | Park |
| 7,203,511 B2 | 4/2007 | Trachewsky et al. |
| 7,268,598 B2 | 9/2007 | Zolfaghari |
| 7,463,176 B2 | 12/2008 | Nariman et al. |
| 7,463,696 B2 | 12/2008 | Simon |
| 7,512,423 B2 | 3/2009 | Karaoguz |
| 7,564,922 B2 | 7/2009 | Kim et al. |
| 2001/0024459 A1 * | 9/2001 | Seo et al. ............ 372/29.021 |
| 2001/0035994 A1 * | 11/2001 | Agazzi et al. ............ 359/152 |
| 2001/0043527 A1 * | 11/2001 | Yoshida ............ 369/47.51 |
| 2002/0050833 A1 | 5/2002 | Jones et al. |
| 2002/0094037 A1 | 7/2002 | Darabi et al. |
| 2002/0101937 A1 | 8/2002 | Antonio et al. |
| 2002/0135378 A1 | 9/2002 | Coumou |
| 2003/0067359 A1 | 4/2003 | Darabi et al. |
| 2003/0092465 A1 | 5/2003 | Darabi et al. |
| 2003/0112732 A1 * | 6/2003 | Masui et al. ............ 369/59.12 |
| 2003/0181175 A1 | 9/2003 | Darabi |
| 2003/0181176 A1 | 9/2003 | Darabi |
| 2003/0181179 A1 | 9/2003 | Darabi |
| 2003/0181180 A1 | 9/2003 | Darabi |
| 2003/0181181 A1 | 9/2003 | Darabi |
| 2003/0181184 A1 | 9/2003 | Darabi |
| 2003/0181188 A1 | 9/2003 | Darabi |
| 2004/0001560 A1 | 1/2004 | Darabi |
| 2004/0025052 A1 * | 2/2004 | Dickenson ............ 713/201 |
| 2004/0052312 A1 * | 3/2004 | Matero ............ 375/295 |
| 2004/0102173 A1 | 5/2004 | Darabi |
| 2004/0137870 A1 | 7/2004 | Kivekas et al. |
| 2005/0113948 A1 | 5/2005 | Own |
| 2005/0130615 A1 | 6/2005 | Darabi |
| 2005/0164671 A1 | 7/2005 | Darabi |
| 2005/0197092 A1 | 9/2005 | Darabi |
| 2005/0237100 A1 | 10/2005 | Chiu et al. |
| 2006/0002491 A1 | 1/2006 | Darabi |
| 2006/0003719 A1 | 1/2006 | Darabi |
| 2006/0035609 A1 | 2/2006 | Darabi |
| 2006/0035668 A1 | 2/2006 | Li |
| 2006/0038710 A1 * | 2/2006 | Staszewski et al. ............ 341/143 |
| 2007/0014381 A1 | 1/2007 | Rozenblit et al. |
| 2007/0076827 A1 | 4/2007 | Beamish et al. |
| 2007/0190952 A1 | 8/2007 | Waheed et al. |
| 2007/0213022 A1 | 9/2007 | Darabi |
| 2007/0230616 A1 | 10/2007 | Zolfaghari et al. |
| 2008/0284629 A1 | 11/2008 | Nariman et al. |

OTHER PUBLICATIONS

U.S. Appl. No. 11/395,907 Non-Final Office Action mailed Feb. 16, 2011, 17 Pgs.

U.S. Appl. No. 11/395,907 Non-Final Office Action mailed Oct. 17, 2011, 12 Pgs.

U.S. Appl. No. 11/395,907 Non-Final Office Action mailed Jul. 6, 2012, 10 Pgs.

U.S. Appl. No. 11/395,907 Notice of Allowance mailed Feb. 20, 2013, 6 Pgs.

* cited by examiner

POWER CONTROL TECHNIQUES FOR WIRELESS TRANSMITTERS

CROSS-REFERENCE TO RELATED APPLICATIONS

This application is a continuation of U.S. patent application Ser. No. 11/395,907, filed on Mar. 31, 2006, entitled "Power Control Techniques For Wireless Transmitters," now U.S. Pat. No. 8,467,473, issued on Jun. 18, 2013, which is hereby incorporated by reference in its entirety.

BACKGROUND

Wireless transceivers are used in a wide variety of wireless systems. A wireless transceiver may typically include a wireless receiver for receiving and demodulating signals, and a transmitter for modulating signals for transmission. Wireless transceivers may, in some cases, be capable of transmitting on different frequencies or bands. It may be a challenge in some cases for wireless transmitters to control power for data transmission.

SUMMARY

Various embodiments are disclosed relating to wireless systems, and also relating to power control techniques for wireless transmitters.

According to an example embodiment, an apparatus, is provided that may include a digital-to-analog converter (DAC) adapted to convert a digital amplitude signal to an analog amplitude signal during a first transmission mode and adapted to convert a digital power level signal to an analog power level signal during a second transmission mode. For example, the use of one DAC for these two purposes may save silicon or area.

The apparatus may also include a multiplexer having an output coupled to an input of the DAC, the multiplexer may be adapted to receive multiple input signals and to select for output to the DAC either the digital amplitude signal or the digital power level signal. The apparatus may further include a driver circuit adapted to receive a phase modulated signal as a first input, and adapted to receive the analog amplitude signal as a second input during the first transmission mode. The driver circuit may be adapted to output a phase and amplitude modulated signal during the first transmission mode and to output a phase modulated signal during the second transmission mode.

In another embodiment, the apparatus may include a sampling circuit coupled to an output of the DAC. The sampling circuit may pass the analog power level signal from the DAC during a transmission power ramp during the second transmission mode, and may output a sampled value of the analog power level signal from the sampling circuit at least a portion of the time when the transmission power is not ramping during the second transmission mode.

In another example embodiment, an apparatus is provide that may include a digital-to-analog converter (DAC) adapted to convert a digital amplitude signal to an analog amplitude signal during a transmission power ramp, and adapted to convert a digital power level signal to an analog power level signal at least a portion of the time when the transmission power is not ramping.

According to another example embodiment, a method is provided that may include providing a multi-mode digital-to-analog conversion, which may include converting a digital amplitude signal to an analog amplitude signal during a first transmission mode, and converting a digital power level signal to an analog power level signal during a second transmission mode. The method may also include using the analog power level signal for transmission power control during a transmission power ramp for the second transmission mode, and using a sampled value of the analog power level signal for transmission power control during at least a portion of the time when the transmission power is not ramping for the second transmission mode.

DETAILED DESCRIPTION

Figure 1:
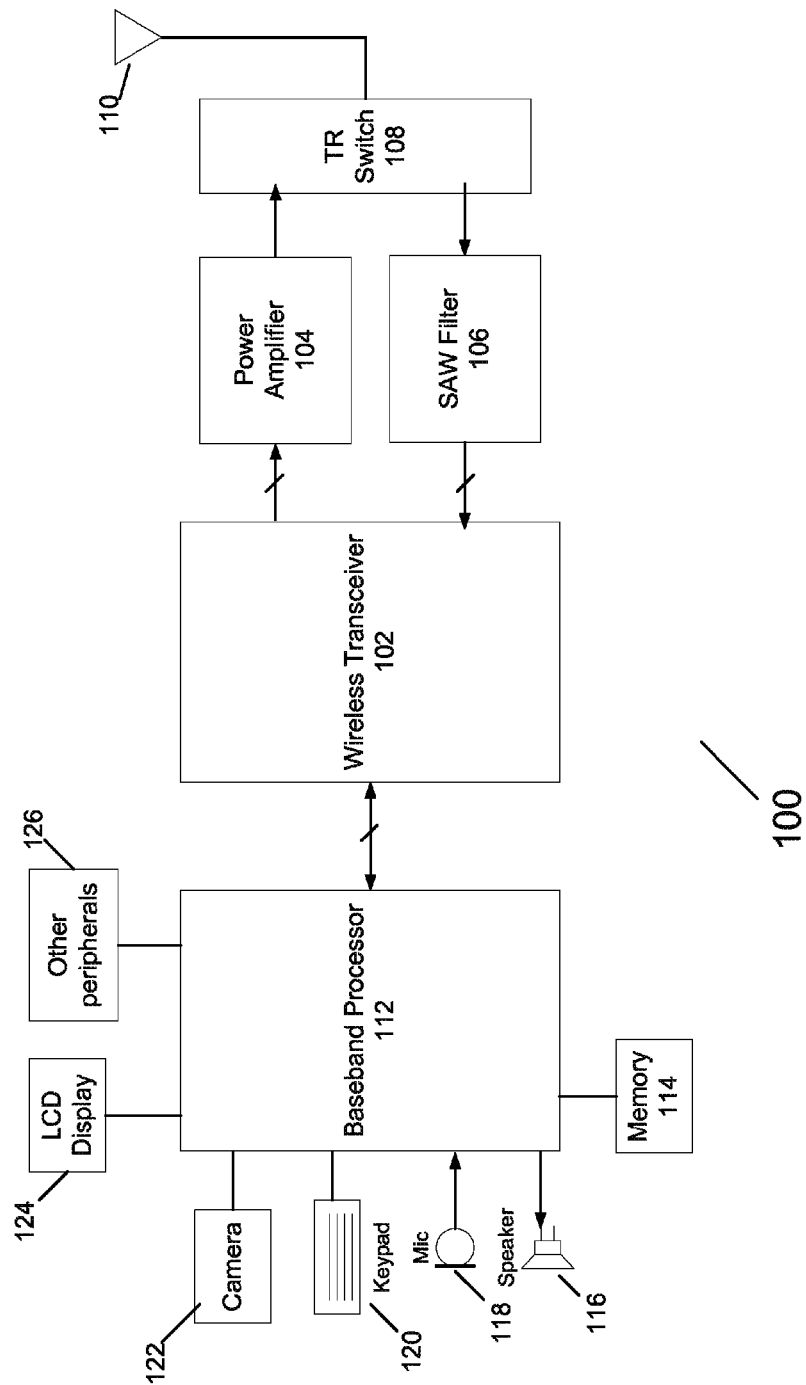
FIG. 1 is a block diagram of a wireless system according to an example embodiment.

FIG. 1 is a block diagram of a wireless system according to an example embodiment. Wireless system 100 may include a wireless transceiver (transmitter/receiver) 102 for transmitting and receiving radio or wireless signals. A baseband processor 112 is coupled to wireless transceiver 110 to perform various types of processing and overall control of system 100, and may perform other tasks. Baseband processor 112 may include a controller, and may include for example, an audio codec to process audio signals, a video or image processing codec (e.g., an MPEG4 compression and/or decompression module), and other components or blocks, not shown.

An antenna 110 may be provided to receive and transmit radio signals or electromagnetic signals. A transmitter/receiver (TR) switch 108 may select either the transmit or receive mode for the antenna 110. Signals output by wireless transceiver 102 to be transmitted may be amplified by amplifier 104 and then transmitted via antenna 110. Signals received via antenna 110 may be filtered by a SAW (surface acoustic wave) filter 106 (or other filter) and then input to transceiver 102. At transceiver 102, the received signals may be processed or demodulated, which may include down-converting the signals to an intermediate frequency (IF) and then down-converting to baseband or other frequency, digital detection of data and other signal processing. Likewise, digital data to be transmitted may be received by transceiver 102 from baseband processor 112. Wireless transceiver 110 may modulate the digital data from baseband processor 112 onto a selected channel or frequency (or range or spectrum of frequencies) for transmission over antenna 110.

A variety of blocks or peripherals may be coupled to baseband processor 112. For example, a memory 114, such as a Flash memory or Random Access Memory (RAM), may store information. A microphone 118 and speaker 116 may allow audio signals to be input to and output by wireless system 100, such as for a cell phone or other communications device. A keypad 120 may allow a user to input characters or other information to be processed by wireless system 100. A camera 122 or other optical device may be provided to allow users to capture photos or images that may be processed and/or stored by system 100 in memory or other storage location. Wireless system 100 may also include a display 124, such as a liquid crystal display for example, to display information (text, images, etc.). A variety of other peripherals 126 may be coupled to baseband processor 112, such as a memory stick, an audio player, a Bluetooth wireless transceiver, a USB (Universal Serial Bus) port, or other peripheral. These are merely a few examples of the types of devices or peripherals that may be provided as part of wireless system 100 or coupled to baseband processor 112, and the disclosure is not limited thereto.

Wireless system 100 may be used in a variety of systems or applications, such as a mobile or cellular phone, a wireless local area network (WLAN) phone, a wireless personal digital assistant (PDA), a mobile communications device, or other wireless device. In an example embodiment, wireless system 100 may be capable of operating in a variety of transmit/receive frequencies or frequency bands and for a variety of different standards or communications protocols. Although not required, wireless system 100 may be a multiband wireless system capable of transmitting or receiving signals on one of a plurality of frequencies or bands. For example, wireless system 100 may operate at or around 1900 MHz for WCDMA (Wide-Band Code Division Multiple Access) or PCS (Personal Communications Services), at or around 1800 MHz for DCS (Distributed Communication Services) (these frequencies may be considered an upper band of frequencies), at 850 MHz for GSM (Global System for Mobile communication), at or around 900 MHz for EGSM (Extended GSM) (these frequencies may be considered a lower band of frequencies). These are merely some example frequencies, and the system 100 may operate at many other frequencies and standards.

According to an example embodiment, wireless transceiver 102 may include a transmitter to modulate and transmit data, and a receiver to receive and demodulate data. Transceiver 102 may modulate received data for transmission, and may demodulate received signals, using a variety of modulation techniques, such as Phase Shift Keying (PSK), 8PSK, Quadrature Amplitude Modulation (QAM), etc., in which data may be modulated using both phase modulation and/or amplitude modulation, for example. Alternatively, phase modulation or frequency modulation, or variations thereof, may be used, such as Gaussian-Filtered Minimum Shift Keying (GMSK), and the like.

According to an example embodiment, transceiver 102 may be a multimode transceiver, capable of operating in dual modes or multiple modes of operation, depending on the situation (e.g., depending on the base station or wireless node to which communication is desired). According to an example embodiment, in a first mode of operation, transceiver 102 may operate in an EDGE (Enhanced Data Rates For GSM Evolution) mode, which may use both amplitude and phase modulation (e.g., via 8PSK), for example. In a second mode of operation, transceiver 102 may operate in a GSM mode, which may use phase modulation for example (e.g., GMSK). This is merely one example embodiment, and there are several examples described below for such a dual mode example (EDGE/GSM modes). However, transceiver 102 is not limited to this example (EDGE/GSM), as the variety of techniques and embodiments described herein may be applied to a wide variety of other modes and/or modulation techniques. The term phase modulation (or phase modulated), as used herein, may include phase modulation, frequency modulation, and/or variations thereof.

Figure 2:
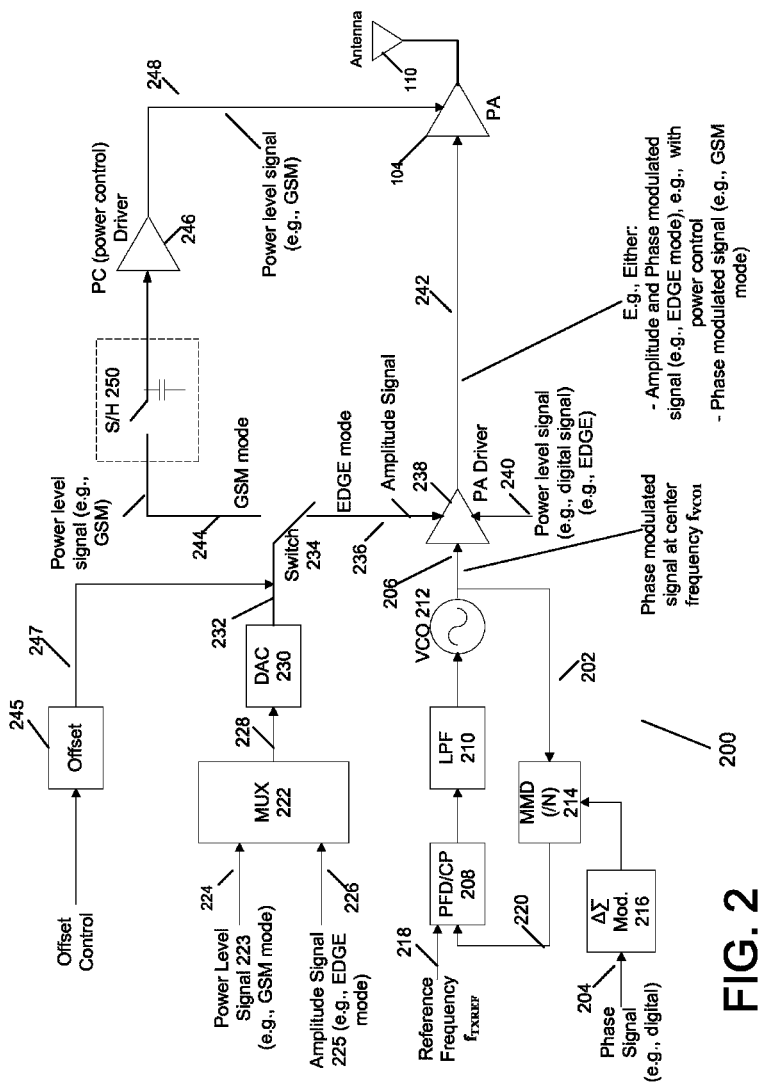
FIG. 2 is a block diagram of a wireless transceiver according to an example embodiment.

FIG. 2 is a block diagram illustrating a transmitter according to an example embodiment. Transmitter 200, illustrated in FIG. 2, may be just a portion of a transmitter that may be included in transceiver 102, according to an example embodiment. The transmitter 200 may include other blocks or components not shown in FIG. 2, for example.

Referring to FIG. 2, a phase-locked loop (PLL) 202 may receive a digital phase signal via line 204 and generate a phase modulated signal via line 206. PLL 202 will be briefly described. PLL 202 may include a phase frequency detector and charge pump (PFD/CP) 208, a low pass filter (also known as a loop filter) 210, a voltage controlled oscillator (VCO) 212, a multi-modulus divider (MMD) 214, and a delta-sigma (Δs) modulator 216, according to an example embodiment.

In FIG. 2, with reference to PLL 202, a (e.g., digital) phase signal is input via line 204, and a reference frequency (or reference signal) is provided via line 218. The output frequency of VCO 212 ($f_{VCO1}$) is divided by an integer divider number (N) of MMD 214 (which may be an integer-N divider). The integer divider number (N) is selected by, for example, a 1-bit delta-sigma (ΔΣ) modulator 216 based on phase signal received via line 204. MMD 214 may be considered to be a multi-modulus divider (MMD) since the divider number (N) used by MMD 214 may be one of multiple different numbers (integers), e.g., 32, 33, . . . 64. A selected fractional-N divide ratio (average N) by dynamically switching the divider number (N2) of MMD 214 between two or more integer numbers.

An operation of the example PLL 202 will be briefly described. The transmitter reference frequency ($f_{TXREF}$) may be input as a reference signal via line 218 to PFD/CP 208. Regarding PFD/CP 208, the PFD may generate an output signal(s) based on the phase difference between its two input signals. For example, an up signal or a down signal may be output by PFD based on whether the divided frequency signal on line 220 leads or lags the reference frequency signal ($f_{TXREF}$) on line 218, respectively. The charge pump (CP) of PFD/CP 208 may generate positive or negative charge pulses based on whether the divided frequency signal on line 220 leads or lags the reference signal ($f_{TXREF}$) on line 218, respectively. Programmable low pass filter (LPF) 210 may integrate or accumulate the charge pulses to generate a voltage, which, for example, may indicate the amount that the divided frequency signal on line 220 leads or lags the reference frequency ($f_{TXREF}$) on line 218. The voltage output by LPF 210 may control or adjust the frequency ($f_{VCO1}$) output by VCO 220. In addition, according to an example embodiment, by varying the divider number (N) used by MMD 214, VCO 220 may output a phase modulated frequency spectrum onto line 206, having a selected center frequency at $f_{VCO1}$.

A multiplexer (mux) 222 may receive multiple signals, such as a power level signal 223 via line 224, and an amplitude signal 225 via line 226. Power level signal 223 may be a digital signal that may be used for transmission power control for transmitter 200, and may be used in a GSM mode of operation, for example. The amplitude signal 225 may be a digital signal that may be used to provide or control amplitude modulation, e.g., in an EDGE mode or other mode of operation that may use amplitude modulation, for example.

According to one example embodiment, during an EDGE mode, mux 222 selects and outputs the amplitude signal 225 received via line 226 onto line 228. On the other hand, during GSM mode, mux 222 may select and output power level signal 223 received via line 224 onto line 228. Digital-to-analog converter (DAC) 230 may convert the digital signal received via line 228 and output an analog signal onto line 232. For example, in one example embodiment, during EDGE mode of operation, DAC 230 may typically receive and convert a digital amplitude signal 225 to an analog amplitude signal, which is output onto line 232. Likewise, during GSM (or EGSM) mode, DAC 230 may receive and convert a digital power level signal 223 to an analog power level signal, which is output onto line 232. According to an example embodiment, DAC 230 may be a high-resolution, oversampled delta-sigma DAC, although many different types of DACs may be used.

The operation of transmitter 200 in EDGE mode will now be briefly described. In EDGE mode, according to an example embodiment, digital amplitude signal 225 is selected by mux 222 and applied to input line 228 of DAC 230. DAC 230 outputs an analog amplitude signal onto line 232. Switch 234 is configured to output the analog amplitude signal via line 236 to a power amplifier (PA) driver 238 (or other driver circuit). PA driver 238 may receive a phase modulated signal via line 206. PA driver 238 may also receive a power level signal via line 240 (e.g., for power control for EDGE mode). In an example embodiment, PA driver 238 may generate a phase and amplitude modulated signal (based on the received phase modulated signal and amplitude signal) that has been power-adjusted based on the power level signal received via line 240. The power-adjusted amplitude and phase modulated signal may be output via line 242 to power amplifier (PA) 104. PA 104 may be an external PA, or an internal PA, as examples. The amplified signal is output by PA 104 for transmission via antenna 110, for example. The amplification at PA driver 238 may be linear, while the amplification at PA 104 may be non-linear, for example.

Figure 3:
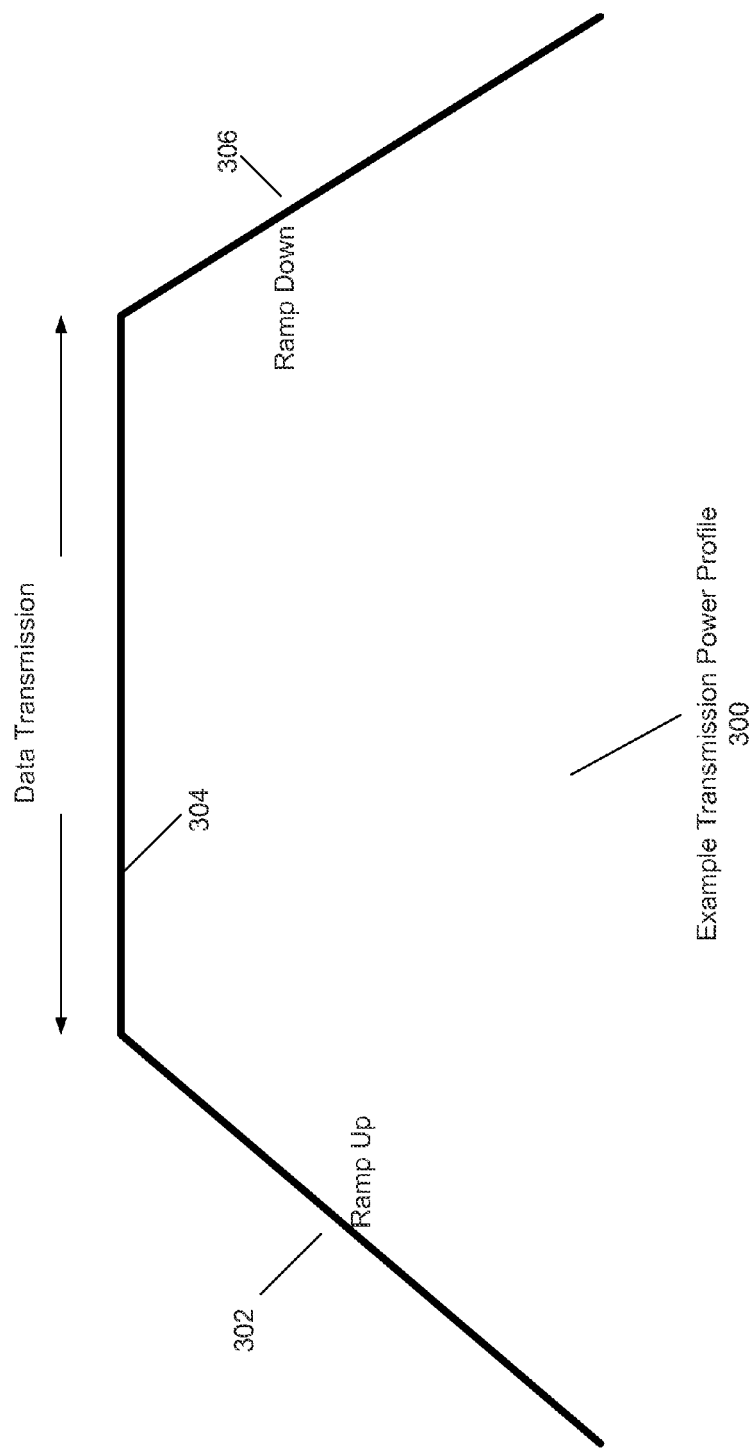
FIG. 3 is a diagram illustrating a transmission power (ramp) profile 300 according to an example embodiment.

FIG. 3 is a diagram illustrating a transmission power (ramp) profile 300 according to an example embodiment. The transmission power for transmitter 200 may start from a low value, e.g., zero, and may increase before data transmission, as shown by the ramp up 302 of the power profile. After ramping up, the power level may remain substantially constant (and/or may vary based on AM information) during 304 to allow for data of a frame or packet to be transmitted. Thus, period 304 may be referred to as data transmission period. After the data for the packet or frame has been transmitted, the power may ramp down at 306. The power profile 300 shown in FIG. 3 may repeat itself for each packet or frame of data to be transmitted. This may allow sufficient power to be applied for data transmission, while conserving power on the transmitter when data is not being transmitted, for example.

According to an alternative example embodiment in EDGE mode, rather than applying power level signal via line 240 to PA driver 238, a power level signal may be input (e.g., via line 224) to DAC 230 and input to PA driver 240 via line 236 during a ramp up 302 (FIG. 3) and ramp down 306 of the transmission power profile 300. After ramp up 302 (and before ramp down 306), the amplitude signal 225 may be applied to DAC 230 and then an analog amplitude signal input via line 236 to PA driver 238 (e.g., during data transmission period 304 of power profile). This analog amplitude signal may be used to provide a phase and amplitude modulated signal for data transmission. Thus, in this alternative embodiment in EDGE mode, a high resolution DAC 230 may be used for both a power level signal (during ramping 302, 306 of power profile 300) and an amplitude signal (during data transmission period 304), and may also share one input (line 236) to PA driver 238. The power level may applied to DAC 230 and then input to PA driver 238 during power profile ramping (instead of amplitude signal) because no data is being transmitted during power ramp up 302 and ramp down 306 (thus, amplitude information is typically not meaningful during this power ramping). This may allow both the power level signal and amplitude signal to share the same DAC 230, thus conserving silicon or area, according to an embodiment.

The operation of transmitter 200 in GSM (or EGSM) mode will now be briefly described. In GSM mode, according to an example embodiment, digital power level signal 223 is selected by mux 222 and applied to input line 228 of DAC 230. Thus, in GSM mode, for example, DAC 230 may typically output an analog power level signal onto line 232. According to an example embodiment, an offset signal may control an offset circuit 245 to generate an offset value that is input to switch 234 via line 247 (e.g., to ensure that the DAC output does not go lower than a certain value). The offset value may, in some cases, be added to or subtracted from the DAC output value. The offset circuit 245 may also operate in other modes of operation, such as the EDGE mode described above.

In this GSM mode, switch 234 is configured to output the analog power level signal via line 244 to a power control (PC) driver 246 (or other driver circuit). PC driver 246 may output the analog power level signal to PA 104 via line 248. PA 104 may receive a phase modulated signal via line 242, and may adjust the power of the phase modulated signal based on the received power level signal. Note that in this example GSM mode, phase modulation may typically be performed (or some variation thereof), e.g., and may not in some cases perform amplitude modulation, although the embodiment is not limited thereto. The power-adjusted phase modulated signal may be output by PA 104 to antenna 110 for transmission.

However, in some cases, DAC 230 may generate unwanted spurs (e.g., spurious tones or signals) if the input to DAC 230 is constant or substantially constant, in an example embodiment. Therefore, in an alternative embodiment of the GSM mode, in order to decrease such spurs, a sample and hold (S/H) circuit 250 may be provided, e.g., which may include a switch and a capacitor to store a voltage or sampled value. In an example embodiment, the analog power level signal output from DAC 230 may be used and input to PA 104 for power control during a transmission power ramp (ramp up 302 and ramp down 306 of transmission power profile 300). During the power ramp 302, 306, S/H circuit 250 may be closed or on so as to pass the power level signal output from the DAC 230 for power control. There will typically be no spur problem during power profile ramping 302/306 since the value will not be constant, but will be increasing or decreasing, for example. At the end of ramp 302, the S/H circuit 250 may typically provide or store a recent sample value of the power level signal output from DAC 230. During data transmission period 304, the switch from S/H circuit 250 may be opened and a recently sampled value from S/H circuit 250 is used to provide power control to PA 104. This may allow the actual power level signal from DAC 230 to provide power control during ramp up 302 and ramp down 306 of the power profile 300 (FIG. 3), while using the value stored in S/H circuit 250 during data transmission period 304. By using the value from the S/H circuit 250 during period 304 (e.g., where power level may be substantially constant or level in some cases), spurs output from DAC 230 during period 304 may be avoided, in an example embodiment.

Figure 4:
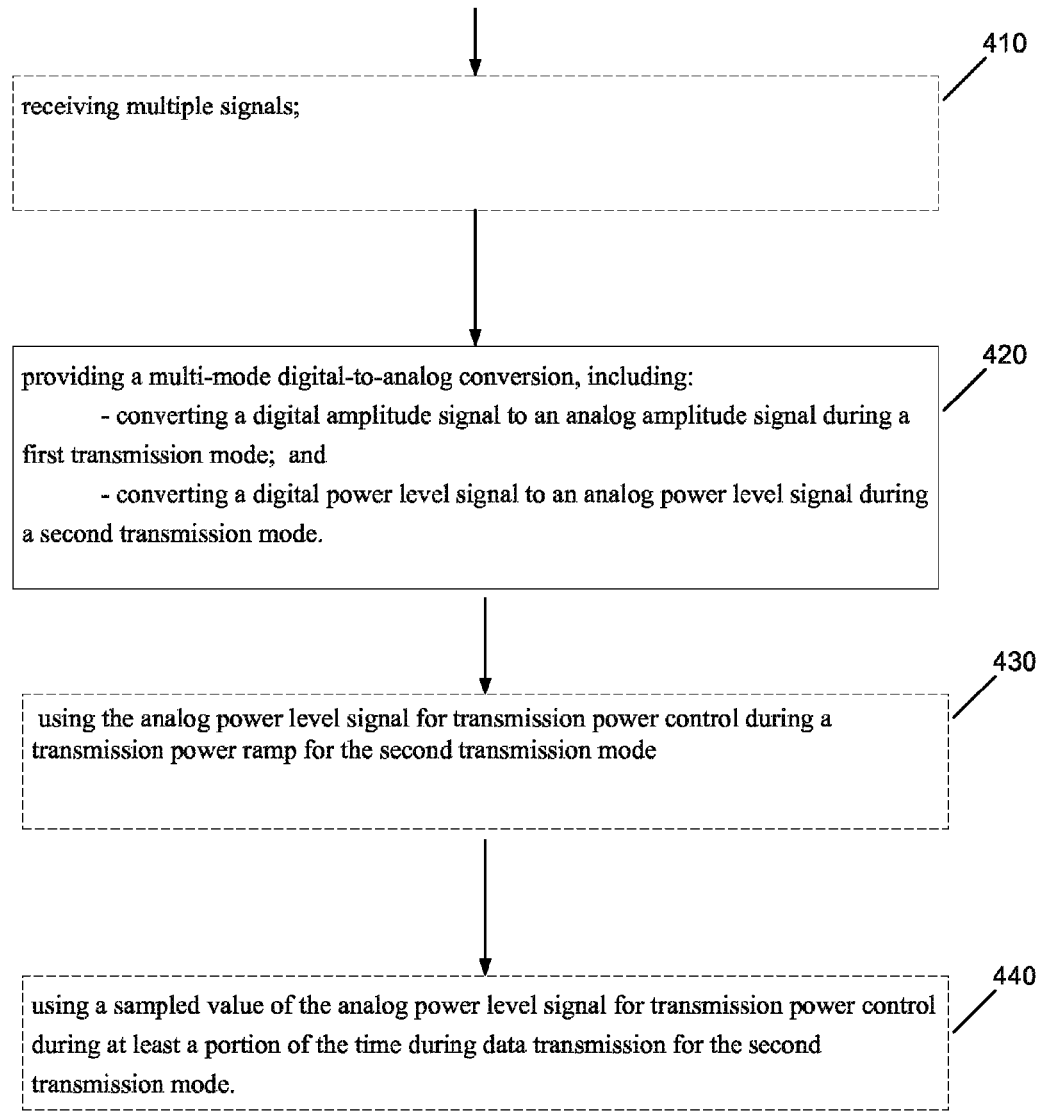
FIG. 4 is a flow chart illustrating operation of a transmitter according to an example embodiment.

FIG. 4 is a flow chart illustrating operation of a transmitter according to an example embodiment. At 410, a plurality of signals may be received (e.g., receiving a digital amplitude signal at DAC 230 during a first transmission mode, and receiving a digital power level signal at DAC 230 during a second transmission mode). At 420, a multi-mode digital-to-analog conversion (e.g., DAC shared for multiple modes) is provided, that may include: converting a digital amplitude signal to an analog amplitude signal during a first transmission mode (e.g., EDGE mode or other mode that uses at least amplitude modulation). And, converting a digital power level signal to an analog power level signal during a second transmission mode (e.g., GSM mode or other mode that uses phase modulation).

The flow chart of FIG. 4 may include one or more additional blocks or operations. At 430, the analog power level signal is used (e.g., by PA 104) for transmission power control during a transmission power ramp (e.g., ramp up 302, ramp down 306) for the second transmission mode. And, at 440, a sampled value of the analog power level signal (e.g., output by S/H circuit 250) is used (e.g., by PA 104) for transmission power control during at least a portion of the time (e.g., at least a portion of period 304) when the transmission power is not ramping, e.g., for the second transmission mode.

Figure 5:
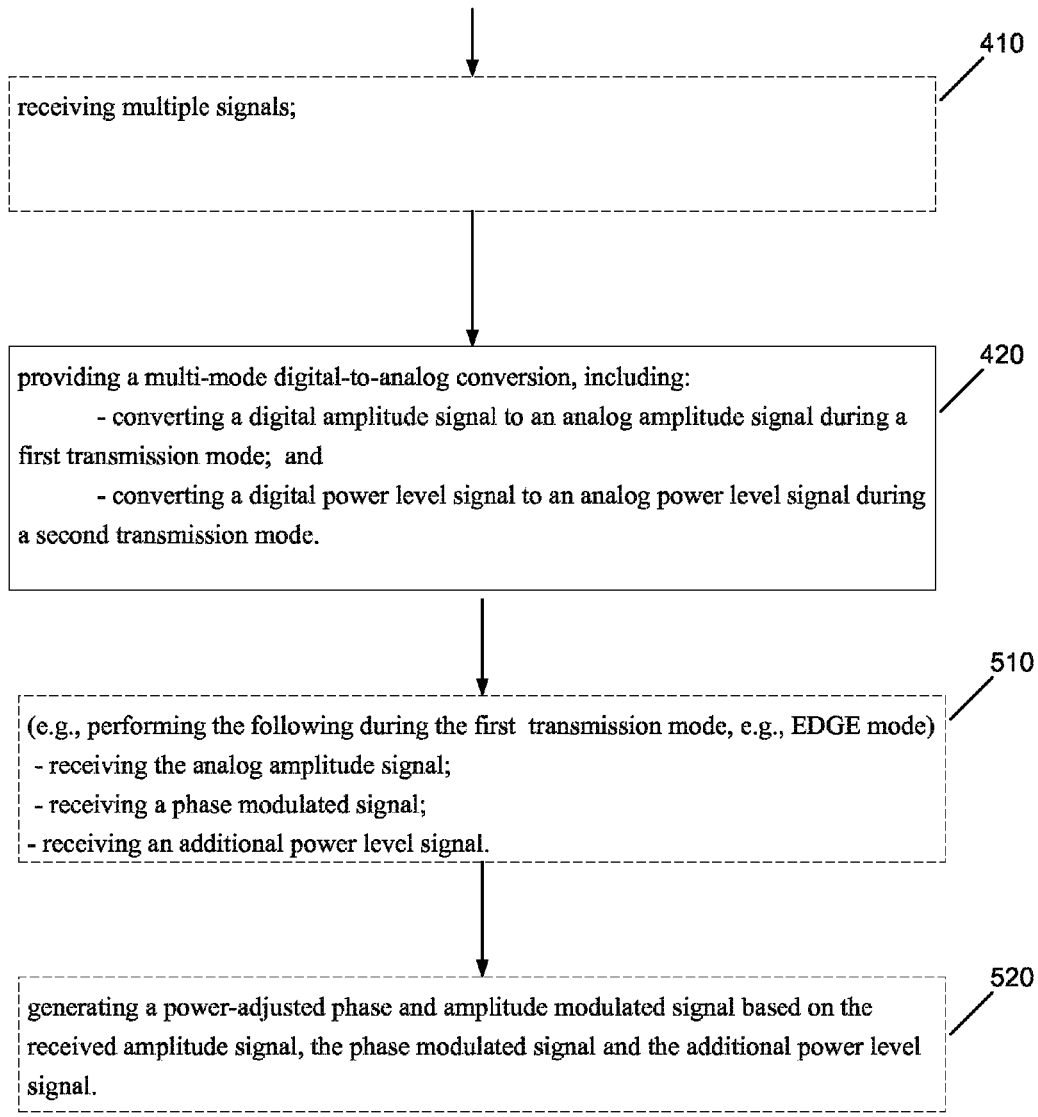
FIG. 5 is a flow chart illustrating an operation of a transmitter according to an example embodiment.

FIG. 5 is a flow chart illustrating an operation of a transmitter according to an example embodiment. According to an example embodiment, FIG. 5 may include operations 410 and 420 as in FIG. 4, and may include additional operations 510 and 520. Operations 510 and 520, for example, may typically be performed for the first transmission mode (e.g., when transmitter is in EDGE mode). At 510, an analog amplitude signal (e.g., via line 236), a phase modulated signal (e.g., via line 206), and an additional power level signal (e.g., via line 240) are received (e.g., received by PA driver 238). At 520, a power-adjusted phase and amplitude modulated signal is generated (e.g., by PA driver 238) based on the received amplitude signal, phase modulated signal and power level signal.

Figure 6:
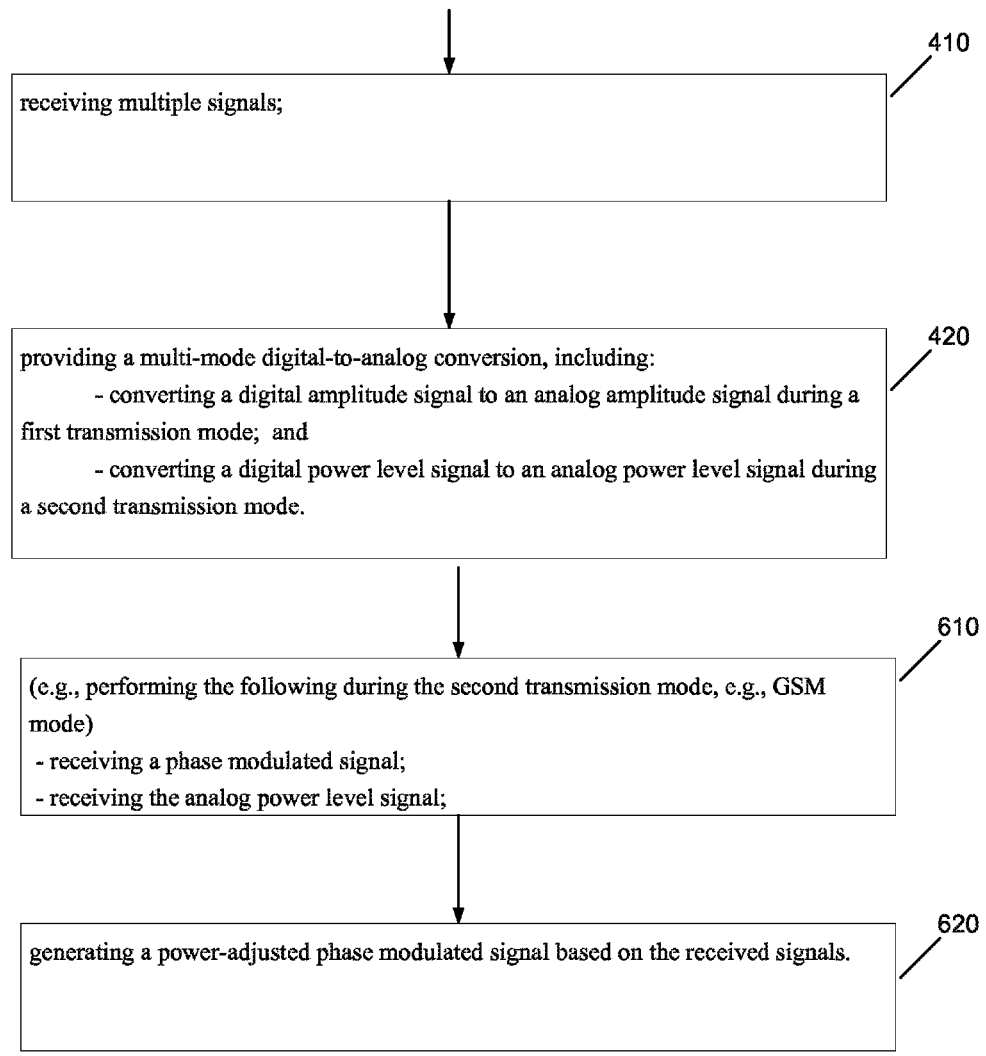
FIG. 6 is a flow chart illustrating an operation of a transmitter according to an example embodiment.

FIG. 6 is a flow chart illustrating an operation of a transmitter according to an example embodiment. According to an example embodiment, FIG. 6 may include operations 410 and 420 as in FIG. 4, and may include additional operations 610 and 620. Operations 610 and 620, for example, may typically be performed for the second transmission mode (e.g., GSM mode). At 610, a phase modulated signal (e.g., via line 242) and an analog power level signal (e.g., via line 248) may be received (e.g., received by PA 104). At 620, a power adjusted phase modulated signal is generated (e.g., by PA 104) based on the received signals.

Figure 7:
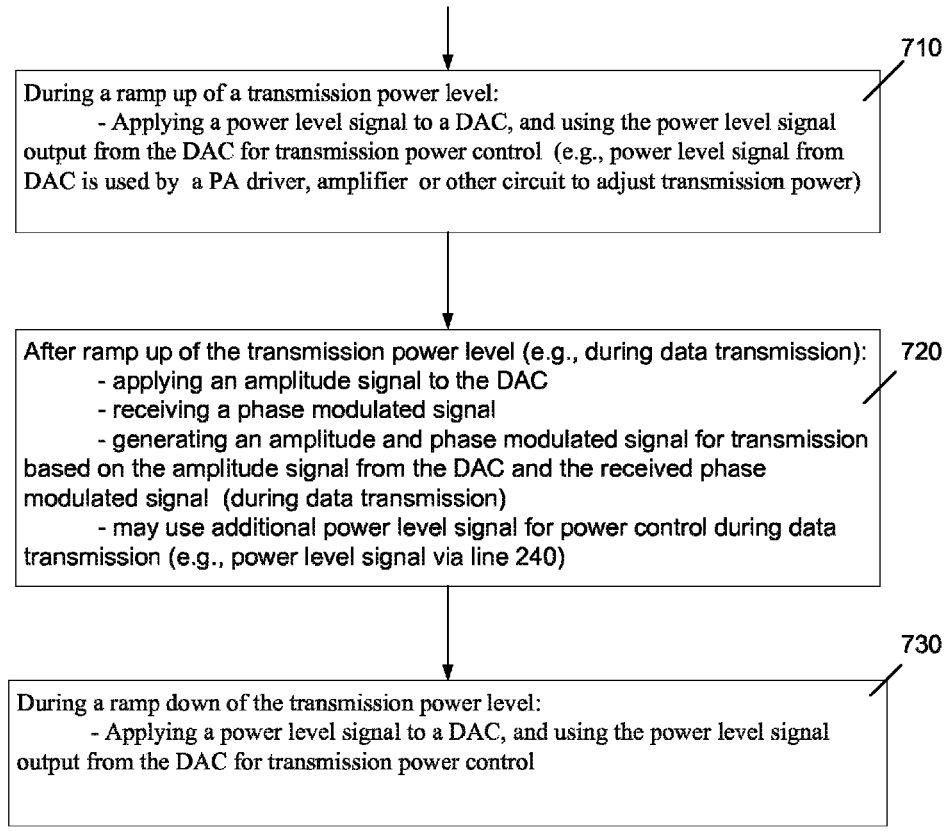
FIG. 7 is a flow chart illustrating an operation of a transmitter according to another embodiment.

FIG. 7 is a flow chart illustrating an operation of a transmitter according to another embodiment. The flow chart of FIG. 7 may be used, for example, for EDGE mode or other mode that may include both amplitude and phase modulation, although it may be applied to other modes as well.

At 710, during a ramp up (e.g., 302) of a transmission power level, the following may be performed:
Applying a power level signal (e.g., via line 236) to a DAC (e.g., DAC 230), and using the power level signal output from the DAC for transmission power control (e.g., power level signal from DAC 230 is used by a PA driver such as PA driver 238, amplifier or other circuit to adjust transmission power).

At 720, after ramp up (e.g., after ramp up 302) of the transmission power level (e.g., at the beginning of period 304), the following may be performed:
applying an amplitude signal to the DAC (e.g., DAC 230);
receiving a phase modulated signal (e.g., at PA driver 238 via line 206);
generating an amplitude and phase modulated signal (e.g., by PA driver 238) for transmission based on the amplitude signal from the DAC and the received phase modulated signal (e.g., generate an output signal for data transmission period 304). In one embodiment, PA driver 238 may perform power control during data transmission period 304 based on an additional power level signal (e.g., power level signal received via line 240). (In yet another embodiment, the additional power level signal received via line 240 may be used for power control during ramp periods 302, 306 and during data transmission period 304).

At 730, during a ramp down (e.g., 306) of the transmission power level, the following may be performed:
Applying a power level signal (e.g., via line 236 and/or 240) to a DAC, and using the power level signal output from the DAC for transmission power control.

Figure 8:
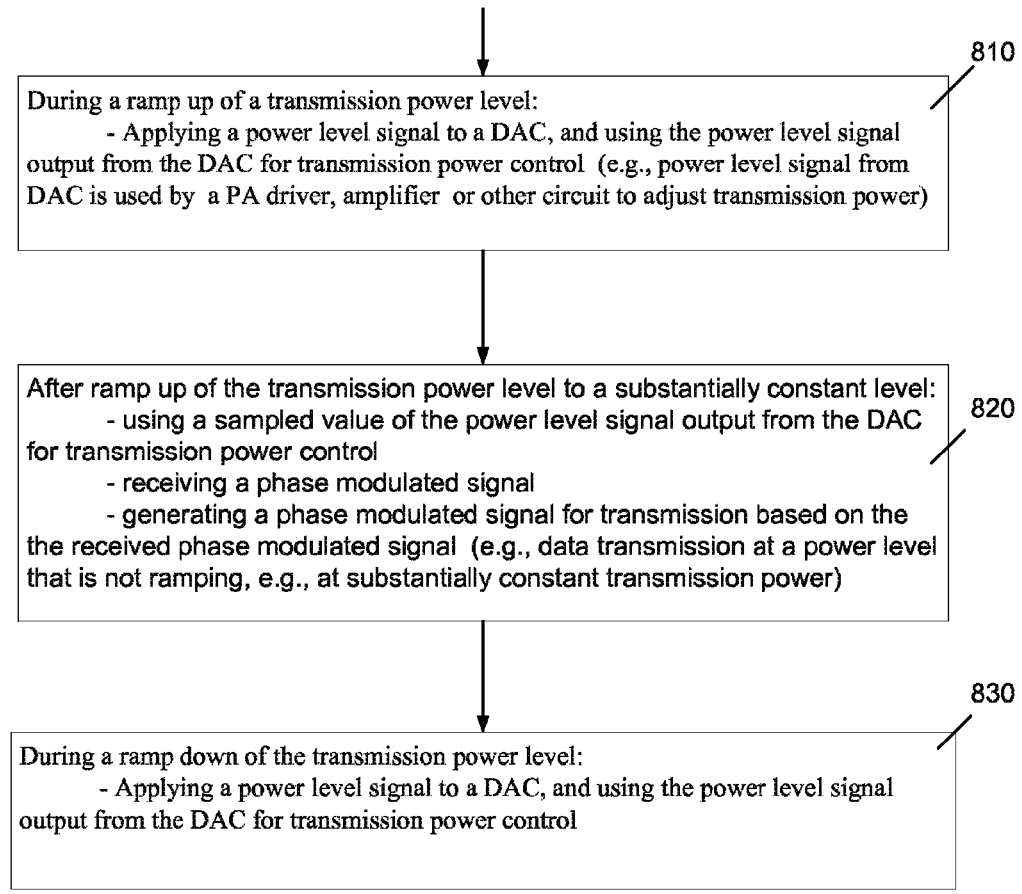
FIG. 8 is a flow chart illustrating an operation of a transmitter according to another example embodiment.

FIG. 8 is a flow chart illustrating an operation of a transmitter according to another example embodiment. The operations of FIG. 8 may typically be used by a GSM or EGSM mode, or other mode that may use phase modulation for example.

At 810, during a ramp up of a transmission power level, the following may be performed:
Applying a power level signal to a DAC, and using the power level signal output from the DAC for transmission power control (e.g., power level signal from DAC is used by a PA driver, amplifier or other circuit to adjust transmission power).

At 820, after ramp up of the transmission power level, the following may be performed:
using a sampled value (e.g., from S/H circuit 250) of the power level signal output from the DAC for transmission power control;
receiving a phase modulated signal;
generating a phase modulated signal for transmission based on the received phase modulated signal (e.g., data transmission at a power level that is not ramping, e.g., at substantially constant transmission power in some cases).

At 830, during a ramp down of the transmission power level, the following may be performed:
applying a power level signal to a DAC, and using the power level signal output from the DAC for transmission power control.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:
1. An apparatus comprising:
a digital-to-analog converter (DAC) adapted to convert a digital amplitude signal to an analog amplitude signal during a first transmission mode and adapted to convert a digital power level signal to an analog power level signal during a second transmission mode; and
a switch coupled to an output of the DAC and configured to be operable to couple the analog amplitude signal output of the DAC through a sampling circuit to a power control circuit during a first transmission mode, and to couple the analog power level signal to a driver circuit during a second transmission mode;
wherein one of the transmission modes includes a transmission mode that employs at least amplitude modulation, and
wherein another one of the transmission modes includes a transmission mode that employs at least phase modulation or frequency modulation.
2. The apparatus of claim 1 wherein the DAC comprises a DAC adapted to convert a digital amplitude signal to an analog amplitude signal during a first transmission mode and adapted to convert a digital power level signal to an analog power level signal during a second transmission mode, the first transmission mode comprising EDGE transmission mode, the second transmission mode comprising GSM/EGSM transmission mode.

3. The apparatus of claim 1 and further comprising a multiplexer having an output coupled to an input of the DAC, the multiplexer adapted to receive multiple input signals and to select for output to the DAC either the digital amplitude signal or the digital power level signal.

4. The apparatus of claim 1 and further comprising a driver circuit adapted to receive a phase modulated signal as a first input, and adapted to receive the analog amplitude signal as a second input during the first transmission mode, the driver circuit adapted to output a phase and amplitude modulated signal during the first transmission mode and to output a phase modulated signal during the second transmission mode.

5. The apparatus of claim 1 and further comprising a sampling circuit coupled to an output of the DAC, the sampling circuit adapted to pass the analog power level signal from the DAC during a transmission power ramp during the second transmission mode, and to output a sampled value of the analog power level signal from the sampling circuit during data transmission during the second transmission mode.

6. The apparatus of claim 1 and further comprising:
   a voltage controlled oscillator (VCO) to output a phase modulated signal;
   a driver circuit adapted to receive the phase modulated signal from the VCO as a first input, the driver circuit also adapted to receive the analog amplitude signal as a second input and a first transmission mode power level signal as a third input during the first transmission mode, the driver circuit adapted to output a phase and amplitude modulated signal during the first transmission mode and to output a phase modulated signal during the second transmission mode.

7. The apparatus of claim 6 and further comprising a power amplifier having an input coupled to an output of the driver circuit.

8. An apparatus comprising:
   a digital-to-analog converter (DAC) adapted to convert a digital amplitude signal to an analog amplitude signal during a first transmission mode and adapted to convert a digital power level signal to an analog power level signal during a second transmission mode; and
   a circuit, operating in the first transmission mode, receiving a phase modulated signal as a first input, receiving the output from the DAC as a second input, and receiving as a third input an additional power level signal, the circuit adapted to adjust or control the transmission power level during transmission power ramp and during data transmission based on the additional power level signal, the circuit also adapted to output a phase and amplitude modulated signal during data transmission;
      wherein one of the transmission modes includes a transmission mode that employs at least amplitude modulation, and
      wherein another one of the transmission modes includes a transmission mode that employs at least phase modulation or frequency modulation.

9. The apparatus of claim 8 wherein the DAC comprises a DAC adapted to convert a digital amplitude signal to an analog amplitude signal during a first transmission mode and adapted to convert a digital power level signal to an analog power level signal during a second transmission mode, the first transmission mode comprising EDGE transmission mode, the second transmission mode comprising GSM/EGSM transmission mode.

10. The apparatus of claim 8 and further comprising a multiplexer having an output coupled to an input of the DAC, the multiplexer adapted to receive multiple input signals and to select for output to the DAC either the digital amplitude signal or the digital power level signal.

11. The apparatus of claim 8 and further comprising a driver circuit adapted to receive a phase modulated signal as a first input, and adapted to receive the analog amplitude signal as a second input during the first transmission mode, the driver circuit adapted to output a phase and amplitude modulated signal during the first transmission mode and to output a phase modulated signal during the second transmission mode.

12. The apparatus of claim 8 and further comprising a switch coupled to an output of the DAC to couple the analog amplitude signal output of the DAC to a sampling circuit during a first transmission mode, and to couple the analog power level signal to a driver circuit during a second transmission mode.

13. The apparatus of claim 8 and further comprising a sampling circuit coupled to an output of the DAC, the sampling circuit adapted to pass the analog power level signal from the DAC during a transmission power ramp during the second transmission mode, and to output a sampled value of the analog power level signal from the sampling circuit during data transmission during the second transmission mode.

14. The apparatus of claim 8 and further comprising:
   a voltage controlled oscillator (VCO) to output a phase modulated signal;
   a driver circuit adapted to receive the phase modulated signal from the VCO as a first input, the driver circuit also adapted to receive the analog amplitude signal as a second input and a first transmission mode power level signal as a third input during the first transmission mode, the driver circuit adapted to output a phase and amplitude modulated signal during the first transmission mode and to output a phase modulated signal during the second transmission mode.

15. The apparatus of claim 8 and further comprising a power amplifier having an input coupled to an output of the driver circuit.

16. An apparatus comprising:
   a digital-to-analog converter (DAC) adapted to convert a digital amplitude signal to an analog amplitude signal during a first transmission mode and adapted to convert a digital power level signal to an analog power level signal during a second transmission mode; and
   a sampling circuit coupled to an output of the DAC, the sampling circuit configured to pass the analog power level signal from the DAC during a transmission power ramp during the second transmission mode, and to output a sampled value of the analog power level signal from the sampling circuit during data transmission during the second transmission mode;
      wherein one of the transmission modes includes a transmission mode that employs at least amplitude modulation, and
      wherein another one of the transmission modes includes a transmission mode that employs at least phase modulation or frequency modulation.

17. The apparatus of claim 16 and further comprising a switch coupled to an output of the DAC to couple the analog amplitude signal output of the DAC to a sampling circuit during a first transmission mode, and to couple the analog power level signal to a driver circuit during a second transmission mode.

18. The apparatus of claim 16 wherein the DAC comprises a DAC adapted to convert a digital amplitude signal to an analog amplitude signal during a first transmission mode and adapted to convert a digital power level signal to an analog power level signal during a second transmission mode, the first transmission mode comprising EDGE transmission mode, the second transmission mode comprising GSM/EGSM transmission mode.

19. The apparatus of claim 16 and further comprising a multiplexer having an output coupled to an input of the DAC, the multiplexer adapted to receive multiple input signals and to select for output to the DAC either the digital amplitude signal or the digital power level signal.

\* \* \* \* \*